United States Patent
Jackson et al.

(10) Patent No.: US 11,482,618 B2
(45) Date of Patent: Oct. 25, 2022

(54) METHODS OF FORMING DISLOCATION ENHANCED STRAIN IN NMOS AND PMOS STRUCTURES

(71) Applicant: Daedalus Prime LLC, Bronxville, NY (US)

(72) Inventors: Michael Jackson, Portland, OR (US); Anand Murthy, Portland, OR (US); Glenn Glass, Beaverton, OR (US); Saurabh Morarka, Hillsboro, OR (US); Chandra Mohapatra, Beaverton, OR (US)

(73) Assignee: Daedalus Prime LLC, Bronxville, NY (US)

( * ) Notice: Subject to any disclaimer, the term of this patent is extended or adjusted under 35 U.S.C. 154(b) by 0 days.

(21) Appl. No.: 17/723,582

(22) Filed: Apr. 19, 2022

(65) Prior Publication Data

US 2022/0238714 A1 Jul. 28, 2022

Related U.S. Application Data

(60) Division of application No. 17/499,605, filed on Oct. 12, 2021, which is a continuation of application No.
(Continued)

(51) Int. Cl.
*H01L 21/336* (2006.01)
*H01L 29/78* (2006.01)
(Continued)

(52) U.S. Cl.
CPC ...... *H01L 29/7848* (2013.01); *H01L 29/0673* (2013.01); *H01L 29/1033* (2013.01);
(Continued)

(58) Field of Classification Search
CPC ............ H01L 29/7848; H01L 29/0673; H01L 29/1033; H01L 29/1054; H01L 29/32;
(Continued)

(56) References Cited

U.S. PATENT DOCUMENTS

| 7,902,008 | B2 | 3/2011 | Peidous et al. |
| 8,228,233 | B2 | 7/2012 | Montag et al. |

(Continued)

FOREIGN PATENT DOCUMENTS

| CN | 1716607 A | 1/2006 |
| CN | 101038933 A | 9/2007 |

(Continued)

OTHER PUBLICATIONS

Notice of Allowance from Chinese Patent Application No. 201380079159.0, dated Sep. 21, 2020, 8 pgs.
(Continued)

*Primary Examiner* — Tan N Tran
(74) *Attorney, Agent, or Firm* — Kinney & Lange, P. A.

(57) ABSTRACT

Methods of forming a strained channel device utilizing dislocations disposed in source/drain structures are described. Those methods and structures may include forming a thin silicon germanium material in a source/drain opening of a device comprising silicon, wherein multiple dislocations are formed in the silicon germanium material. A source/drain material may be formed on the thin silicon germanium material, wherein the dislocations induce a tensile strain in a channel region of the device.

13 Claims, 5 Drawing Sheets

Related U.S. Application Data

17/389,611, filed on Jul. 30, 2021, now abandoned, which is a continuation of application No. 16/509,421, filed on Jul. 11, 2019, now Pat. No. 11,107,920, which is a division of application No. 14/912,594, filed as application No. PCT/US2013/061859 on Sep. 26, 2013, now Pat. No. 10,396,201.

(51) Int. Cl.
*H01L 29/66* (2006.01)
*H01L 29/10* (2006.01)
*H01L 29/06* (2006.01)
*H01L 29/32* (2006.01)
*H01L 29/165* (2006.01)

(52) U.S. Cl.
CPC .......... *H01L 29/1054* (2013.01); *H01L 29/32* (2013.01); *H01L 29/66568* (2013.01); *H01L 29/66636* (2013.01); *H01L 29/66795* (2013.01); *H01L 29/785* (2013.01); *H01L 29/165* (2013.01)

(58) Field of Classification Search
CPC ......... H01L 29/66568; H01L 29/66636; H01L 29/66795; H01L 29/785
USPC .......................... 257/288; 438/300, 301, 305
See application file for complete search history.

(56) References Cited

U.S. PATENT DOCUMENTS

| | | | |
|---|---|---|---|
| 2005/0029601 | A1 | 2/2005 | Chen et al. |
| 2007/0032024 | A1 | 2/2007 | Peidous et al. |
| 2007/0212879 | A1 | 9/2007 | Grasby et al. |
| 2008/0079054 | A1 | 4/2008 | Kim |
| 2008/0121932 | A1* | 5/2008 | Ranade ............. H01L 21/31055 257/E21.426 |
| 2008/0246019 | A1 | 10/2008 | Bedell et al. |
| 2009/0085062 | A1 | 4/2009 | Jin et al. |
| 2009/0278201 | A1 | 11/2009 | Chatty et al. |
| 2011/0241084 | A1 | 10/2011 | Wu et al. |
| 2011/0316046 | A1 | 12/2011 | Chan et al. |
| 2013/0126976 | A1 | 5/2013 | Yu et al. |
| 2013/0146895 | A1 | 6/2013 | Tsai et al. |
| 2013/0146949 | A1 | 6/2013 | Tsai et al. |
| 2013/0228862 | A1 | 9/2013 | Lee et al. |
| 2013/0307967 | A1 | 11/2013 | D'Agostino et al. |
| 2014/0361335 | A1 | 12/2014 | Flachowsky et al. |
| 2014/0374831 | A1 | 12/2014 | Liaw |

FOREIGN PATENT DOCUMENTS

| | | |
|---|---|---|
| CN | 102208443 A | 10/2011 |
| CN | 102365536 A | 2/2012 |
| CN | 103165536 A | 6/2013 |
| CN | 103165675 A | 6/2013 |
| CN | 103295963 A | 9/2013 |
| KR | 20110109775 A | 10/2011 |
| TW | 200625634 A | 7/2006 |
| TW | 200731460 A | 8/2007 |
| TW | 200746309 A | 12/2007 |
| TW | 200849409 A | 12/2008 |
| TW | 200939355 A | 9/2009 |
| TW | 201338054 A | 9/2013 |

OTHER PUBLICATIONS

Notice of Allowance from Korean Patent Application No. 10-2020-7010630, dated Jan. 5, 2021, 2 pgs.
Notice of Allowance from Taiwan Patent Application No. 103132988, dated Oct. 14, 2019, 3 pages.
Notice of Allowance from Taiwan Patent Application No. 105135333, dated Nov. 22, 2019, 3 pages.
Office Action from Chinese Patent Application No. 201380079159, dated Apr. 21, 2020, 12 pages.
Office Action from Chinese Patent Application No. 201380079159.0, dated Aug. 28, 2019, 6 pgs.
Office Action from European Patent Application No. 13894579.5, dated Oct. 9, 2019, 4 pages.
Office Action from European Patent Application No. 13894579.5, dated Sep. 21, 2020, 7 pgs.
Office Action from Korean Patent Application No. 10-2016-7002007, dated Jan. 13, 2020, 2 pages.
Office Action from Korean Patent Application No. 10-2016-7002007, dated Sep. 2, 2019, 8 pgs.
Office Action from Korean Patent Application No. 10-2020-7010630, dated Jun. 29, 2020, 7 pgs., w/English translation.
Office Action from Taiwan Patent Application No. 105135333, dated Jul. 10, 2019, 6 pages.
Office Action from Taiwan Patent Application No. 108140482, dated Dec. 18, 2020, 16 pgs.
Reexam Decision of Rejection for China Patent Application No. 201380079159.0 no Translation, 15 pgs.
Second Taiwanese Office Action for TW Application No. 108140482, dated May 3, 2021, pp. 13.

* cited by examiner

METHODS OF FORMING DISLOCATION ENHANCED STRAIN IN NMOS AND PMOS STRUCTURES

CROSS-REFERENCE TO RELATED APPLICATIONS

This application is a divisional of U.S. patent application Ser. No. 17/499,605, filed Oct. 12, 2021, which in turn claims benefit of continuation U.S. patent application Ser. No. 17/389,611, filed Jul. 30, 2021, which in turn claims benefit of continuation U.S. patent application Ser. No. 16/509,421, filed Jul. 11, 2019, now Patented Ser. No. 11/107,920 on Aug. 31, 2021, which in turn claims benefit of divisional U.S. patent application Ser. No. 14/912,594, filed Feb. 17, 2016, now Patented U.S. Pat. No. 10,396,201, on Aug. 27, 2019, which in turn claims benefit of PCT International Application No. PCT/US2013/061859, filed Sep. 26, 2013, are hereby incorporated by reference in their entirety.

BACKGROUND

As microelectronic technology advances for higher performance, integration of high performance transistor devices, such as CMOS transistors devices, becomes increasingly important. CMOS transistor improvement may involve controlling the strain state of the transistor channel. Within a CMOS device, an NMOS transistor portion and a PMOS transistor portion may require differing types of channel strain requirements. For example, the NMOS channel may require a tensile strain in the channel region, while the PMOS channel may require a compressive strain in the channel region.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION

Figure 1A:
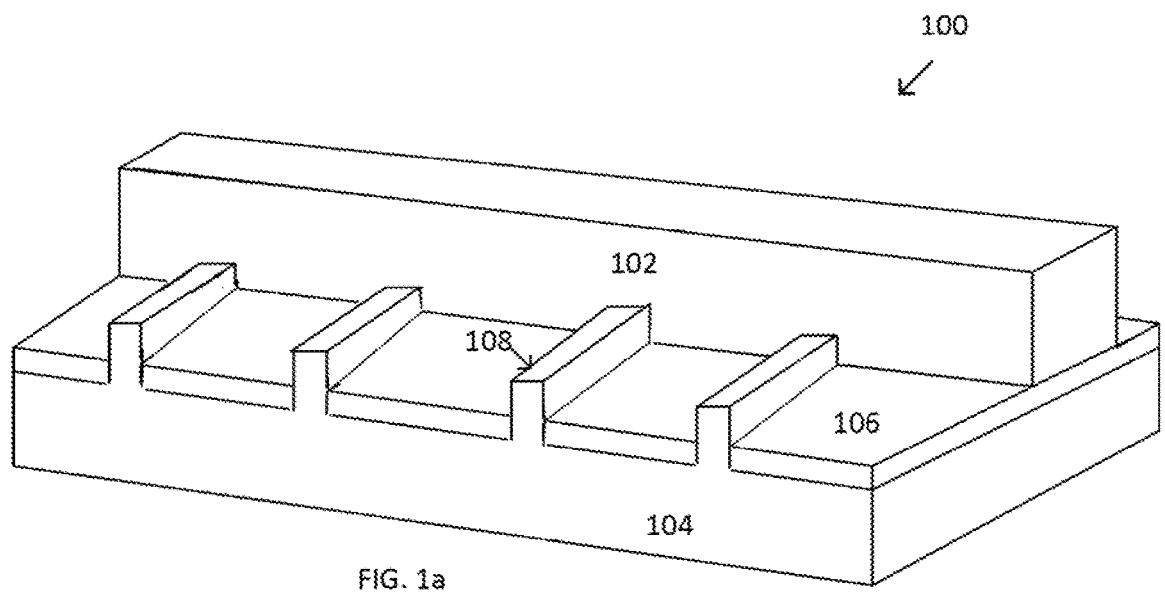
FIGS. 1a-1e represent top and cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as device structures comprising strained source/drain structures, are described. Those methods/structures may include forming a thin silicon germanium material on a source/drain opening of a device comprising silicon, wherein multiple dislocations are formed in the silicon germanium material, and then forming a source/drain material on the thin silicon germanium material, wherein the dislocations induce source/drain dislocations throughout the source/drain material. The embodiments herein enable strained channel devices, wherein the source/drain structures may induce a tensile strain in a channel region of the device.

FIGS. 1a-1e illustrate views of embodiments of forming microelectronic structures, such as NMOS strained silicon transistor structures, for example. In an embodiment, a device 100 may comprise a substrate portion 104 (FIG. 1a, top view). In an embodiment, the substrate 104 may comprise at least one of a silicon, a non-silicon material, a single crystal silicon material, a polysilicon material, a piezoelectric material, III-V material and/or other electromechanical substrate material. In an embodiment, the device 100 may comprise a portion of a planar transistor, a multi-gate transistor, such as a tri-gate and/or FinFET transistor, and a nanowire structure.

The device 100 may further comprise a gate structure 102, which may comprise a portion of a transistor gate structure 102, such as an NMOS transistor gate structure. The device 100 may further comprise source/drain structures 108. The source/drain structures 108 may comprise silicon fin structures, in an embodiment, which may be separated from each other by dielectric material 106. The dielectric material 106 may comprise a STI (silicon trench isolation) material in an embodiment. The dielectric material 106 may provide isolation between the fin structures 108 and the gate electrode 102. In an embodiment, a channel portion of the device 100 may be disposed underneath the gate structure 102.

Figure 1B:
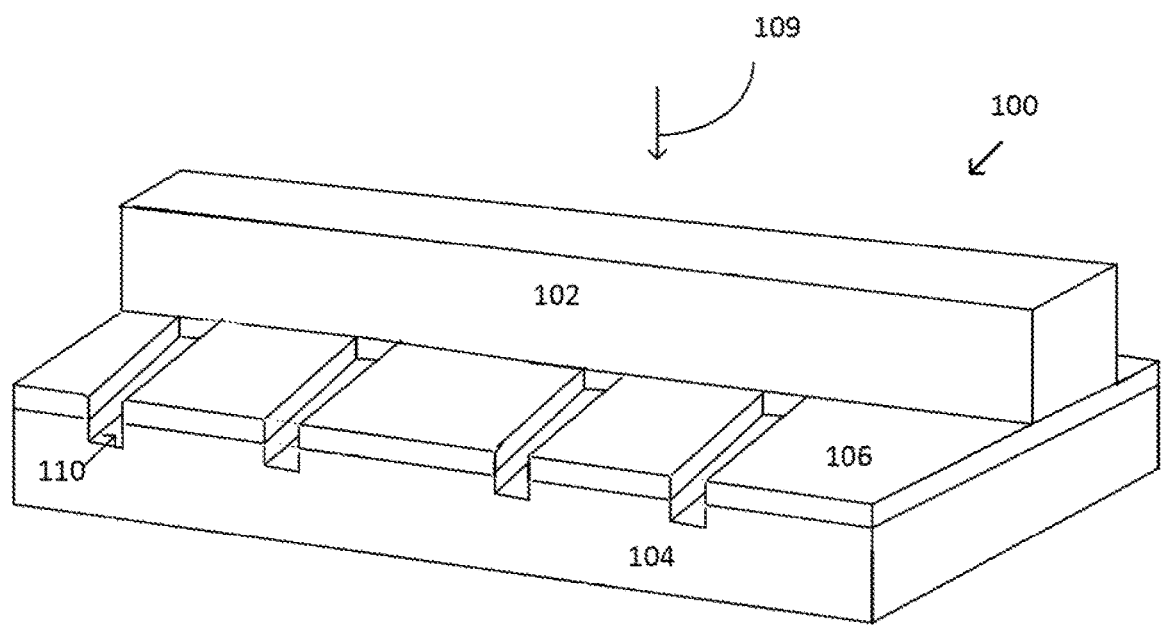
Figure 1C:
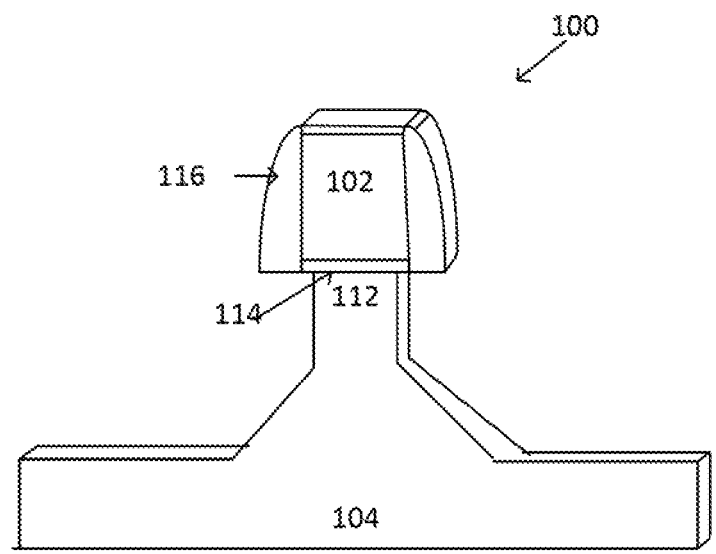

In an embodiment, source/drain structures/fins 108 may be removed from the substrate portion 104 of the device 100 (FIG. 1b, top view). In an embodiment, an etch process 109 may be employed, such as a wet or dry etch, for example, wherein the silicon of the source/drain/fin structures 108 are removed, leaving an opening 110 in the substrate 104 adjacent the STI 106. A channel portion of the silicon underneath the gate electrode remains intact, that is, it remains un-etched by the removal process/etch process 109. FIG. 1c depicts a cross sectional view of the device 100, wherein the source/drain fins 108 are removed and the openings 110 are exposed in a portion of the substrate 104. A channel region 112 is disposed underneath the gate electrode 102, wherein a gate dielectric layer 114 is disposed between the gate electrode 102 and the channel region 112. A spacer material 116 may be disposed on the gate electrode 102.

Figure 1D:
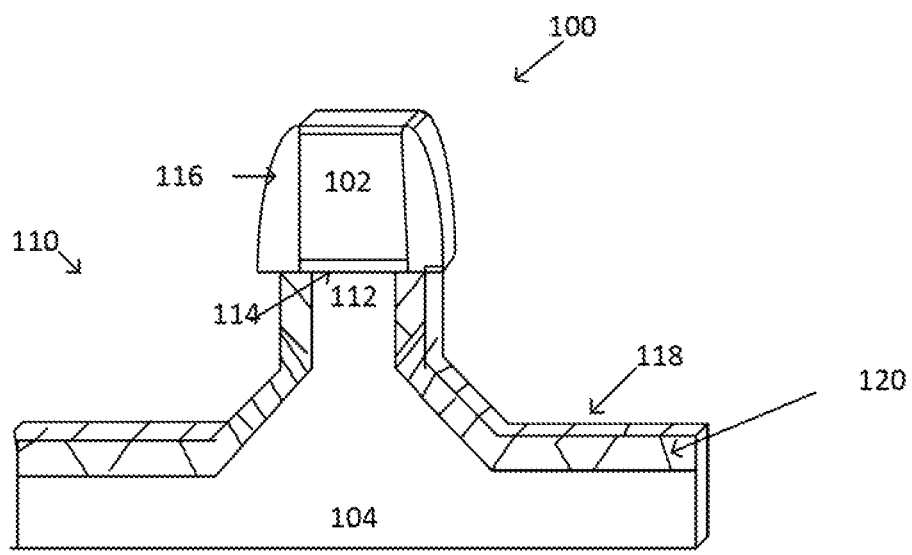

A dislocation nucleation layer/material 118 may be formed in the openings 110 (FIG. 1d, cross section). In an embodiment, the dislocation nucleation layer 118 may be selectively grown using epitaxial growth in the openings 110 on the substrate 104 in the source/drain regions. In an embodiment, the dislocation nucleation layer 118 may comprise a silicon germanium layer 118. The dislocation nucleation layer 118 may be grown such that a plurality of dislocations may form in the dislocation nucleation layer 118. In an embodiment, the dislocation nucleation layer 118 may comprise a thickness of about 2 to about 50 nm.

The dislocation nucleation layer 118 may produce a net strain that comprises a tensile strain. In an embodiment, the lattice constant of the dislocation nucleation layer 118 may be mismatched (and may contribute to stress dislocation formation) as compared with the substrate 104. In an embodiment, the dislocation nucleation layer 118 may comprise a lattice constant that is much larger than the lattice constant of the substrate 104. For example, the lattice constant may comprise between 5.43 and 5.66 A for silicon germanium alloy, and 5.43 A for a silicon substrate. In an embodiment, the dislocation nucleation layer 118 may be formed by epitaxial growth as an initial layer on the silicon portion of the source/drain openings 110. In an embodiment, the source/drain openings may comprise NMOS source/drain openings 110.

In an embodiment, when the dislocation nucleation layer 118 comprises a silicon germanium material, the silicon germanium may comprise a germanium concentration of between about ten percent to about eighty percent. In another embodiment, the silicon germanium may be doped with at least one of phosphorus and arsenic. In an embodiment, the phosphorus may comprise a concentration between about 1016 cm-3 and 1021 cm-3. In an embodiment, the arsenic may comprise a concentration between about 1016 cm-3 and 1021 cm-3. In an embodiment, the dislocation nucleation layer 118 may comprise a silicon germanium, phosphorus, arsenic concentration that is substantially evenly distributed throughout the dislocation nucleation layer 118.

In another embodiment, the dislocation nucleation layer 118 may comprise a lower portion comprising a silicon germanium, phosphorus, and arsenic concentration that is substantially evenly distributed in a lower portion of the dislocation nucleation layer 118, and may comprise an upper portion comprising substantially a silicon phosphorus concentration. In another embodiment, the dislocation nucleation layer 118 may be grown in the openings 110 as an undoped silicon germanium material that may be subsequently doped by one of an ion implantation and a diffusion doping from a dopant source. In another embodiment, the dislocation nucleation layer 118 may be formed using a molecular beam epitaxial method (MBE), such as a gas source (GS)-MBE method.

In an embodiment, a rapid thermal chemical vapor deposition (RT-CVD) reactor or a CVD reactor may be used to grow the dislocation nucleation layer 118. In an embodiment, a process to grow the dislocation nucleation layer 118 may include the use of silane, germane, digermane, phosphine, and hydrochloric acid with a hydrogen carrier gas. A temperature of 700 degrees Celsius and a pressure of 20 Torr may be employed. The parameters for the dislocation nucleation layer 118 growth process may vary depending upon the particular application. In an embodiment, the growth parameters may be optimized for the formation of a plurality of defects. In an embodiment, a large number of dislocations/defects 120 may be formed/initiated at the interface between the substrate 104 and the dislocation nucleation layer 118.

Figure 1E:
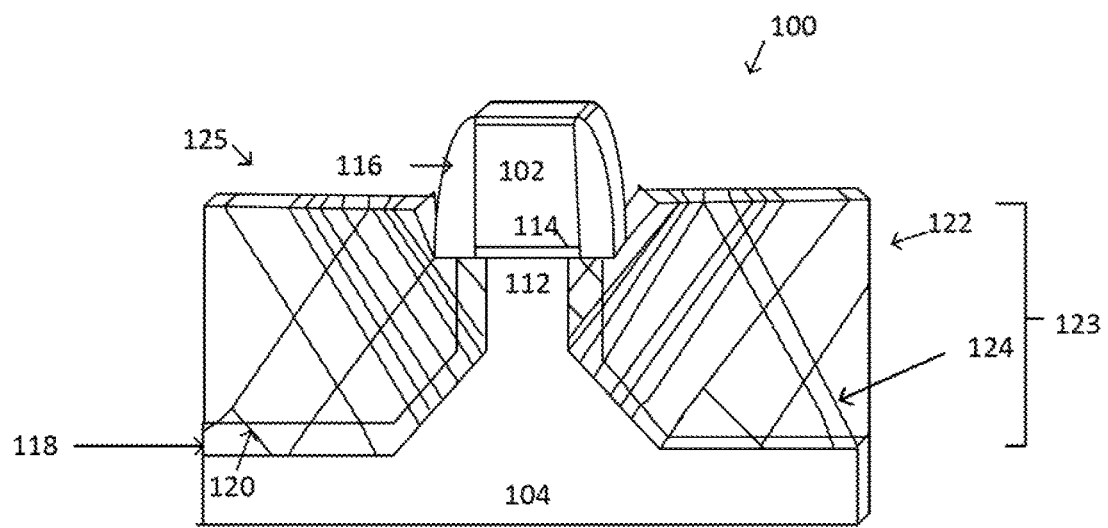

In an embodiment, a source/drain material 122 may be selectively formed on the dislocation nucleation layer 118 after sufficient defect 120 formation in the dislocation nucleation layer 118 (FIG. 1e, cross section). In an embodiment, the source/drain material 122 may comprise of silicon or silicon carbon alloy material. In an embodiment, the source/drain material 122 may comprise a thickness of about 5 to about 100 nm. In an embodiment, the dislocation nucleation layer 118 may provide a source of dislocations/defects 120 that may induce source/drain dislocations 124 in the source/drain material/structure 122. In an embodiment, the dislocation nucleation layer 118 and the source/drain material 122 may comprise a source/drain fin structure 123.

In an embodiment, the dislocations 124 in the source/drain material 122 may continue to propagate up towards a free surface 125 of the source/drain material 122. In an embodiment, the multiple dislocations 124 disposed in the source/drain material 122 may cause a flipping of the strain imparted by the lattice mismatched dislocation nucleation layer 118 from a compressive to a tensile strain in the channel region 112. In an embodiment, overlapping strain fields from each dislocation 124 can overcome the compressive stress that may be present in the dislocation nucleation layer 118, such as a silicon germanium layer 118. In an embodiment, the source/drain material 122 may impart a tensile strain on the channel region 112 along a conduction direction for the device 100, which may comprise a transistor device in embodiments.

In an embodiment, the device 100 may comprise circuitry elements such as transistor structures including planar, trigate and nanowire transistor structures, and any other suitable circuitry elements. The circuitry elements may comprise logic circuitry for use in a processor die, for example. Metallization layers and insulative material may be included in the device 100, as well as conductive contacts/bumps that may couple metal layers/interconnects to external devices. transistor device. The type of elements included in the device 100 may comprise any suitable type of circuit elements, according to the particular application.

Figure 2:
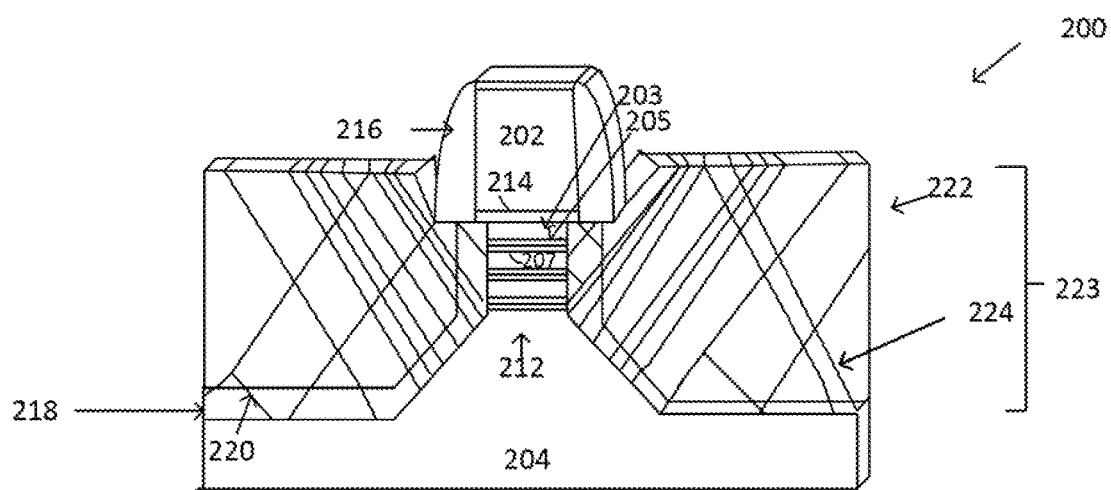
FIG. 2 represents a cross-sectional view of a structure according to embodiments.

FIG. 2 depicts a cross-sectional views of an embodiment comprising a device structure 200, wherein the device comprises a nanowire. In an embodiment, the device 200, such as a nanowire device 200, may comprise a substrate 204 disposed below a channel region 212. A dislocation nucleation layer 218 may comprise a plurality of defects/dislocations 220. A source/drain material 222 may comprise a plurality of defects/dislocations 224. A gate electrode 202 may be disposed on a gate dielectric 214. A nanowire material 203, such as silicon, may be disposed underneath the gate dielectric 214. A wrap around gate dielectric 205 may be disposed beneath the wrap around nanowire material 203. A wrap around gate electrode 207, may be disposed underneath the wrap around gate dielectric 205. The channel region comprises an induced strain from the dislocations from the source/drain material 222.

In an embodiment, the device 100 of the embodiments may be coupled with any suitable type of package structures capable of providing electrical communications between a microelectronic device, such as a die and a next-level component to which the package structures may be coupled (e.g., a circuit board). In another embodiment, the device may be coupled with a package structure that may comprise any suitable type of package structures capable of providing electrical communication between a die and an upper integrated circuit (IC) package coupled with the device layer.

The device described in the various Figures herein may comprise a portion of a silicon logic die or a memory die, for example, or any type of suitable microelectronic device/die. In some embodiments the device of the embodiments may further comprise a plurality of dies, which may be stacked upon one another, depending upon the particular embodiment. In some cases the device may be located/attached/embedded on either the front side, back side or on/in some combination of the front and back sides of a package structure. In an embodiment, the device may be partially or fully embedded in a package structure.

The various embodiments of the strained channel devices herein enable strain transfer from the source/drain region of an NMOS source/drain region to an NMOS channel region. The strain transfer is accomplished through the use of dislocation strain fields in the NMOS source/drain regions. Some prior art methods of achieving channel strain have involved employing buffer layers of mismatched lattice constant materials under the channel region, and employing dopants in the source/drain region. The embodiments herein include employing a dislocation nucleation layer, such as silicon germanium, to propagate overlapping strain fields that induce tensile strain in the channel region. Since the growth takes place only within the source/drain region, the embodiments, avoid performance degradation into the channel as seen when utilizing buffer layers, as in the prior art.

Figure 3:
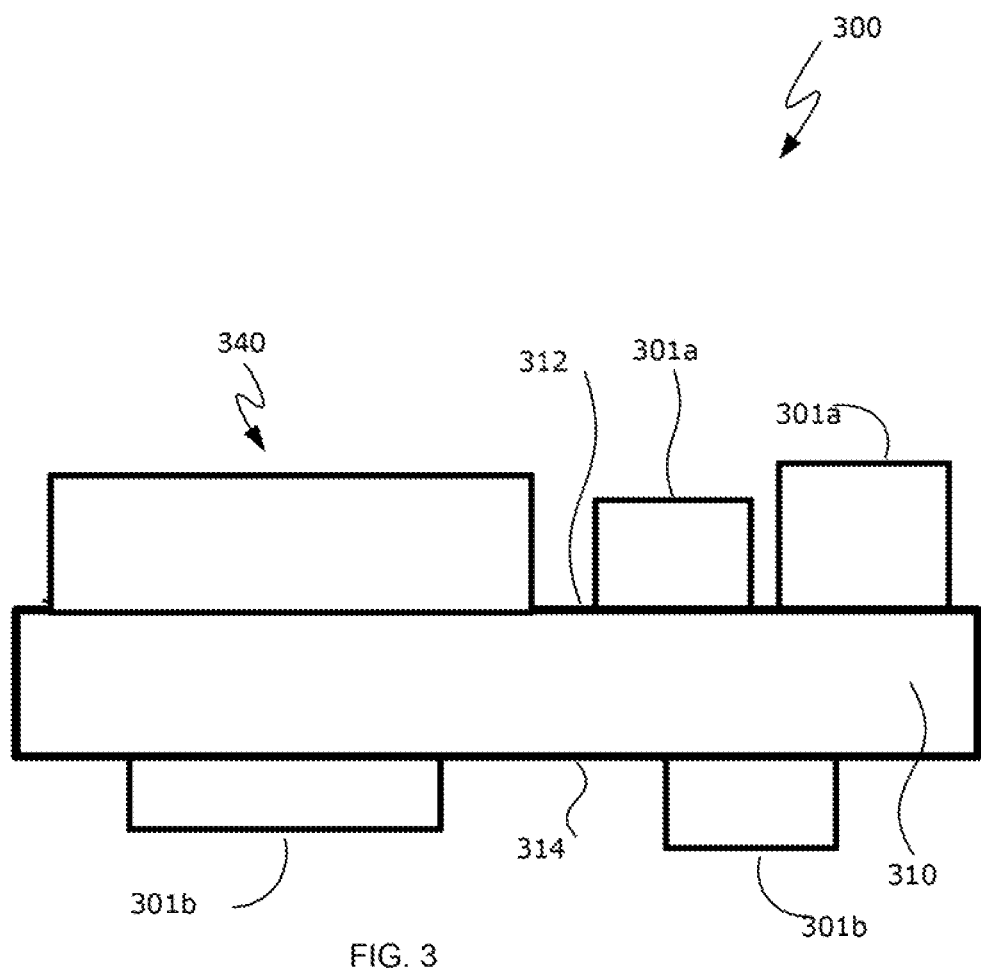
FIG. 3 represents a cross-sectional view of a system according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the device structures, such as the transistor device structures of the embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
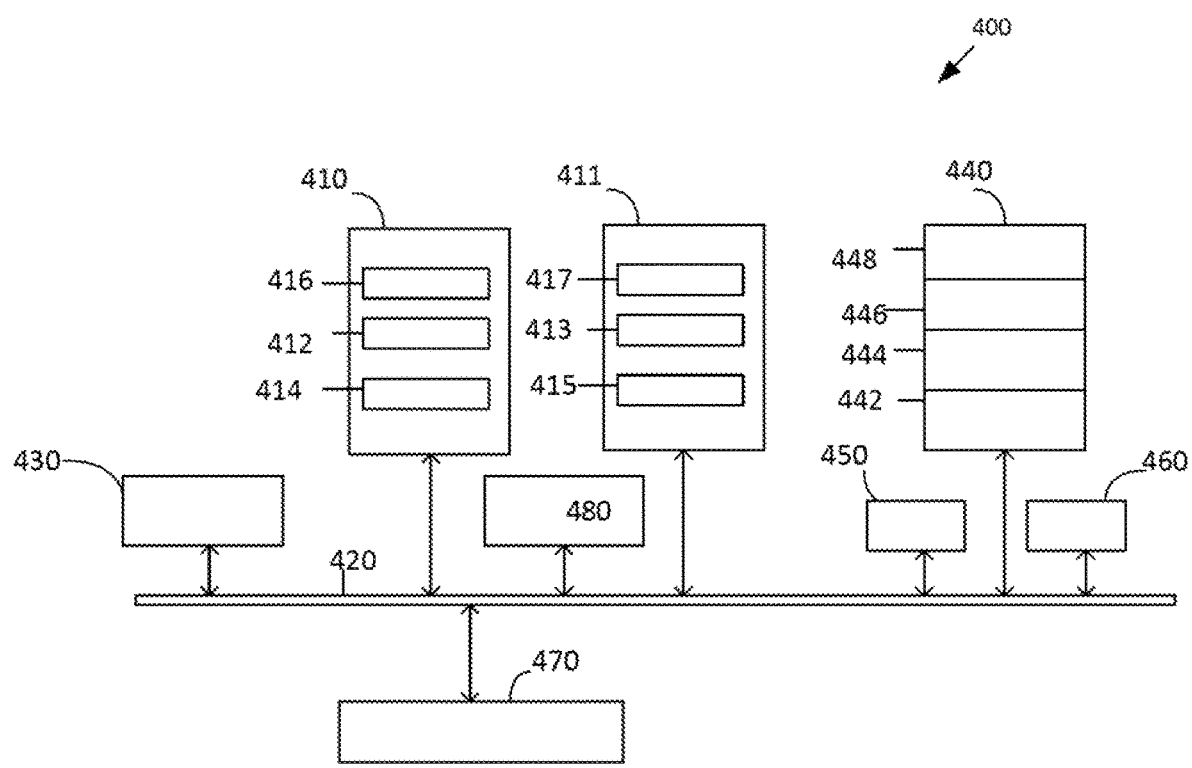
FIG. 4 represents a schematic of a system according to embodiments.

FIG. 4 is a schematic of a computer system 400 according to an embodiment. The computer system 400 (also referred to as the electronic system 400) as depicted can embody/include a package structure that includes any of the several disclosed device embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device structures of the various embodiments included herein. In an embodiment, the integrated circuit 410 includes a processor 412 that can include any type of packaging structures including vertical passive structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

The invention claimed is:

1. A method for fabricating a strained-channel FET transistor comprising:
   presenting a single-crystal semiconductor substrate of a material having a first lattice constant;
   forming a fin of single-crystal semiconductor projecting from the single-crystal semiconductor substrate, the fin extending from a source region, through a channel region, to a drain region;
   forming an isolation dielectric about the fin of single-crystal semiconductor;
   forming a gate dielectric on the channel region of the fin of single-crystal semiconductor;
   depositing a gate electrode upon the gate dielectric;
   etching a first opening in the source region of the fin of single-crystal semiconductor;
   etching a second opening in the drain region of the fin of single-crystal semiconductor;
   epitaxially growing a source nucleation layer having a second lattice constant different from the first lattice constant within the first opening in the source region of the fin of single-crystal semiconductor;
   epitaxially growing a drain nucleation layer having the second lattice constant within the second opening in the drain region the single-crystal semiconductor semiconductor; wherein the second lattice constant is between 5.43 Å and 5.66 Å; wherein each of source and drain materials comprise arsenic and/or phosphorus; wherein the arsenic and/or phosphorus has a concentration between $10^{16}$ cm$^{-3}$ and $10^{21}$ cm$^{-3}$.

2. The method of claim 1, further comprising:
   causing crystalline dislocations to form within the source and drain regions.

3. The method of claim 2, further comprising:
   epitaxially growing source material upon the source nucleation layer, the source material propagating dislocations caused to form within the source region; and
   epitaxially growing drain material upon the drain nucleation layer, the drain material propagating the dislocations caused to form within the drain region.

4. The method of claim 1, wherein the first and second openings in the source and drain regions, respectively, are formed using a wet etchant.

5. The method of claim 1, wherein the first and second openings in the source and drain regions, respectively, are formed using a dry etch process.

6. The method of claim 1, further comprising:
   forming a dielectric spacer on sides of the gate electrode.

7. The method of claim 1, wherein the single-crystal semiconductor substrate comprises silicon.

8. The method of claim 1, wherein each of the source and drain materials comprises silicon-germanium.

9. The method of claim 8, wherein the silicon-germanium of the source and drain materials has a germanium concentration between 10% and 80%.

10. The method of claim 8, wherein the silicon-germanium of the source and drain materials is undoped.

11. The method of claim 1, further comprising:
    forming a nanowire extending from the source region to the drain region.

12. The method of claim 11, wherein the nanowire comprises silicon.

13. The method of claim 12, wherein the gate dielectric surrounds the nanowire.

* * * * *